United States Patent
Dunn et al.

(10) Patent No.: US 7,241,510 B2
(45) Date of Patent: Jul. 10, 2007

(54) PEELABLE CIRCUIT BOARD FOIL

(75) Inventors: Gregory J. Dunn, Arlington Heights, IL (US); Remy J. Chelini, Crystal Lake, IL (US); Timothy B. Dean, Elk Grove Village, IL (US)

(73) Assignee: Motorola, Inc., Schaumburg, IL (US)

( * ) Notice: Subject to any disclaimer, the term of this patent is extended or adjusted under 35 U.S.C. 154(b) by 87 days.

(21) Appl. No.: 11/139,056

(22) Filed: May 27, 2005

(65) Prior Publication Data

US 2006/0269728 A1    Nov. 30, 2006

(51) Int. Cl.
*B32B 15/00* (2006.01)

(52) U.S. Cl. .............. 428/615; 428/629; 428/632; 428/640; 428/670; 428/671; 428/697; 428/702; 428/704

(58) Field of Classification Search .......... 428/615, 428/629, 632, 640, 670, 671, 697, 701–702, 428/703–704
See application file for complete search history.

(56) References Cited

U.S. PATENT DOCUMENTS

| 6,346,355 | B2 | 2/2002 | Sugai et al. |
| 6,872,468 | B1 * | 3/2005 | Dean et al. ............ 428/615 |

* cited by examiner

*Primary Examiner*—Cathy F. Lam

(57) ABSTRACT

In one embodiment, a peelable circuit board foil (200) has a metal support layer (205) and a conductive metal foil layer (210) bonded by an inorganic high temperature release structure (215) that comprises a co-deposited layer (250) and a metal oxide layer (260). The co-deposited layer comprises an admixture of nickel and one or more of boron, phosphorus, and chromium. In a second embodiment, the peelable printed circuit foil (200) has a crystallized dielectric oxide layer (405) disposed on the metal foil layer and an electrode layer (415) disposed on the crystallized dielectric oxide layer, forming a dielectric peelable circuit board foil (400) that may be adhered to a layer of a flexible or rigid circuit board, after which the metal support layer can be peeled away, leaving a capacitive structure including the metal foil layer, the crystallized dielectric oxide layer, and the electrode layer.

12 Claims, 2 Drawing Sheets

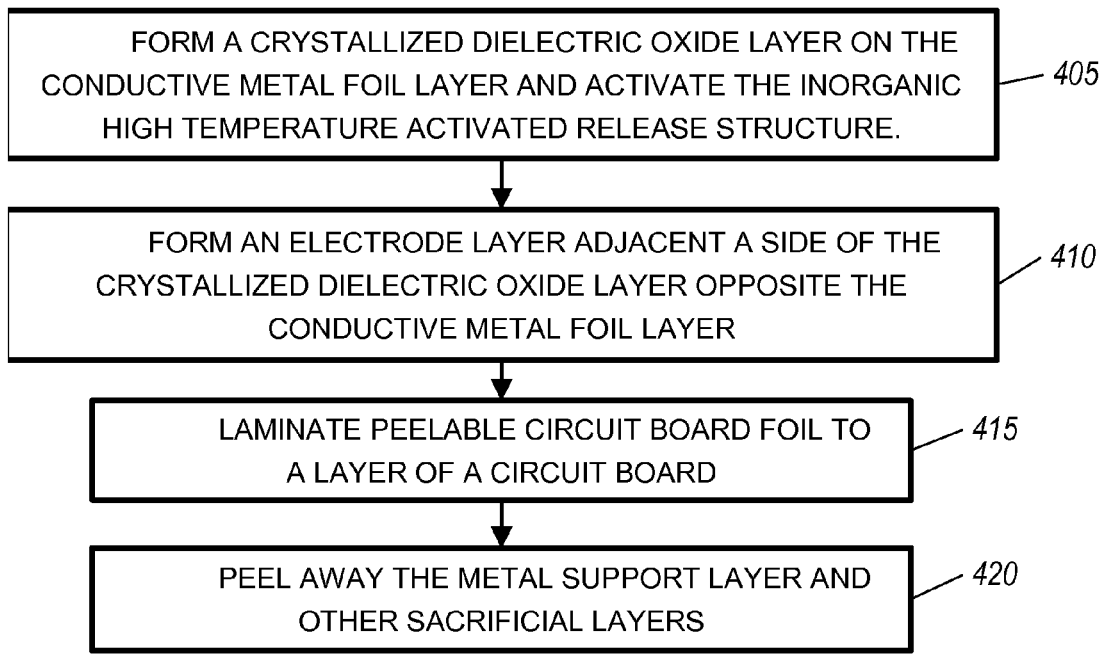
FIG. 4
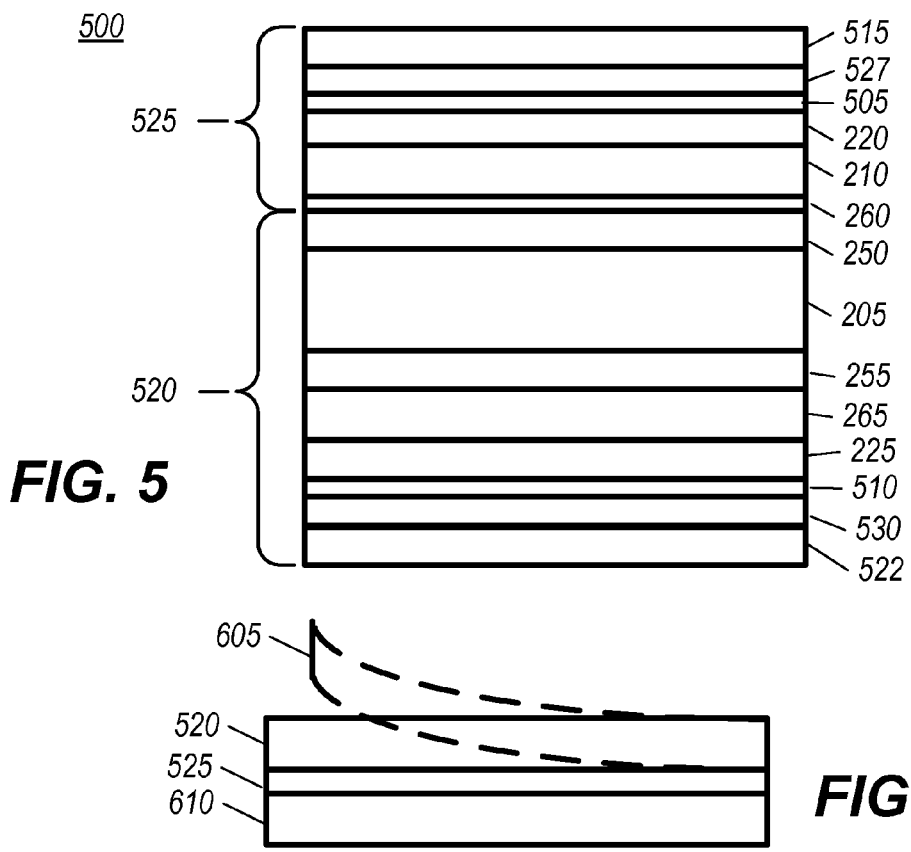
FIG. 5
FIG. 6

PEELABLE CIRCUIT BOARD FOIL

This application is related to U.S. application Ser. No. 10/682,557 filed on Oct. 9, 2003 and published on Apr. 14, 2005 as U.S. Patent Publication US-2005-0079375-A1.

BACKGROUND

The present invention generally relates to multi-layer foils suitable for making capacitors that are integrated or embedded in rigid or flexible single or multilayer circuit boards.

In the electronics art, smaller often means better. In the quest to provide smaller electronic appliances, the electronics industry seeks electronic components that are smaller than predecessor components.

The capacitor (a dielectric material sandwiched between two conductors) represents one electronic component that has substantially shrunk in this quest. However, current practice relies largely on individually mounting and soldering each capacitor onto the surface of circuit boards. Despite the advances in capacitor miniaturization, each surface mounted capacitor still occupies a significant fraction of the circuit board surface area, and requires substantial cost to "pick and place" onto the board. For example, a typical cellular phone contains over 200 surface mounted capacitors connected to circuit boards by over 400 solder joints. The ability to integrate or embed capacitors in circuit boards during manufacture of the circuit boards would provide substantial space and cost savings over surface mounted capacitors. Unfortunately, efforts to make capacitors that can be integrated or embedded into circuit boards have either produced capacitors that do not have sufficient capacitance (e.g. <10 pF/mm$^2$) to replace many of the capacitors (e.g., requiring >100 pF capacitance) on a circuit board, or have resulted in structures and processes that have not been scaled up to manufacturing volumes.

Printed circuit boards typically comprise multiple layers of copper and glass-reinforced epoxy or other polymer. The copper is patterned to form the conducting elements of the circuit, and the polymer provides dielectric isolation and mechanical robustness. Polymers are low dielectric constant materials, and therefore parallel plate embedded capacitors formed within the polymer dielectric circuit board do not offer high capacitance density.

Although ceramic dielectrics that have very high dielectric constants are available, they are typically too rigid to be mechanically compatible with organic printed circuit boards. Further, organic printed circuit boards are incompatible with the methods used to form the ceramic dielectric films. Ceramic dielectric films are commonly formed by a broad range of deposition techniques, such as chemical solution deposition (CSD), evaporation, sputtering, physical vapor deposition and chemical vapor deposition. However, in order to achieve the requisite dielectric structure, such techniques typically require either a high-temperature deposition or a high-temperature crystallization. Such temperatures would melt, ignite or otherwise degrade the organic materials in the circuit board substrate.

Furthermore, these processes are incompatible with copper in two ways. First, at the high temperatures and oxidizing conditions needed to form the ceramic dielectric, copper forms a thin layer of copper oxide at the interface between the ceramic dielectric and the copper. This effectively forms an interface layer which will degrade the overall device performance, thus negating any advantage gained by the use of the ceramic dielectric. Second, the reducing atmosphere favored by copper produces excessive defect concentrations and may frustrate phase formation in the dielectric oxide layer. Efforts to form ceramic films at temperatures that are compatible with circuit board components have generally compromised the dielectric properties of the resulting ceramic. For ceramic dielectrics, it is apparent that favorable dielectric properties are intimately linked to a complex crystal structure (i.e., perovskite) that is difficult to develop at lower temperatures.

Dielectric oxides such as lead zirconate titanate (PZT) and lead lanthanum zirconate titanate (PLZT) belong to a particularly promising class of high permittivity ceramic dielectrics with the perovskite crystal structure. When formed by the CSD process, dielectric oxides can be made into very thin, flexible, robust layers with very high dielectric constants. Several methods have been proposed to create a thin structure that is intended to be added to a circuit board using compatible circuit board layering techniques, by adding a thin coating of dielectric oxide to a thin foil of copper. However, the thin structures described are problematic from a manufacturing standpoint because they are vulnerable to undesirable deformations such as wrinkling and creasing that would compromise the surface uniformity of the dielectric oxide. Coating on one side of such thin substrates also compromises the necessary flatness for further uniform processing. A flat structure can be obtained by coating the dielectric oxide on both sides of the substrate, but no simple process has been described for removal of the resulting unwanted dielectric layer. What is needed is a structure and process for adding capacitors formed of high dielectric constant materials to rigid or flexible circuit boards that is economical to manufacture and wherein the structure is in a form compatible with multilayer circuit board stacking techniques that are in wide use today.

BRIEF DESCRIPTION OF THE DRAWINGS

The present invention is illustrated by way of example and not limitation in the accompanying figures, in which like references indicate similar elements, and in which:

FIG. 4 is a flow chart that shows a method for fabricating a peelable circuit board foil in accordance with a second embodiment of the present invention.

FIG. 5 is a cross section diagram of the peelable circuit board foil fabricated by the method described with reference to FIG. 4.

FIG. 6 is a cross section diagram of the peelable circuit board foil fabricated by the method described with reference to FIG. 4.

Figure 1:
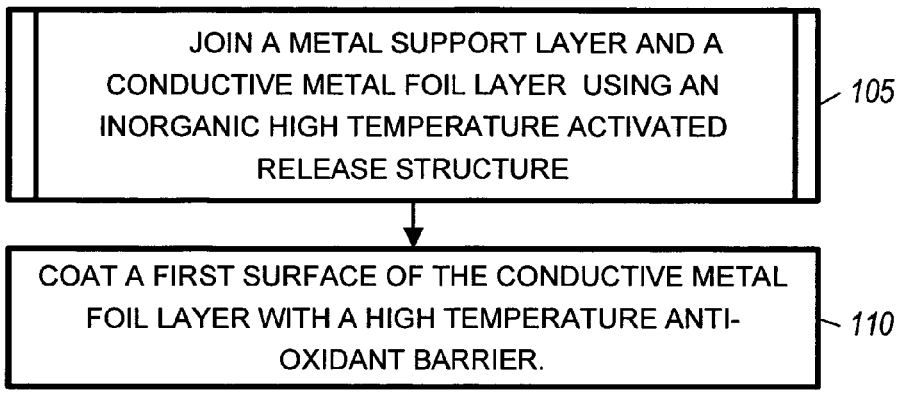
FIG. 1 is a flow chart that shows a method for fabricating a peelable circuit board foil in accordance with some embodiments of the present invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

Before describing in detail the particular peelable circuit board foil in accordance with the present invention, it should be observed that the present invention resides primarily in combinations of method steps and apparatus components related to foils for circuit boards. Accordingly, the apparatus components and method steps have been represented where appropriate by conventional symbols in the drawings, showing only those specific details that are pertinent to understanding the present invention so as not to obscure the disclosure with details that will be readily apparent to those of ordinary skill in the art having the benefit of the description herein.

Figure 2:
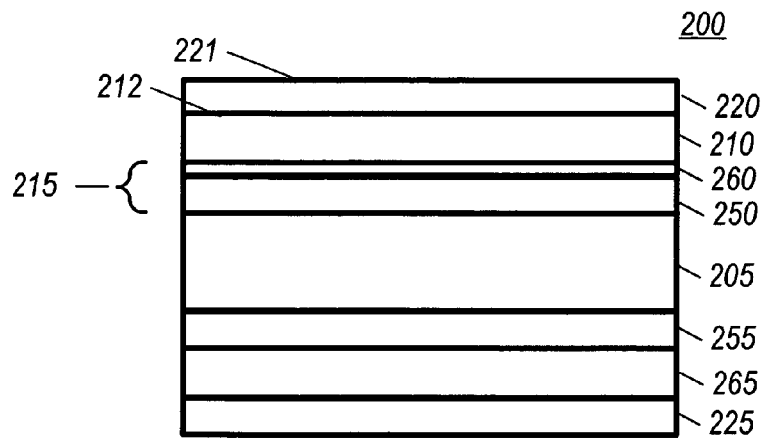
FIG. 2 is a cross section diagram of the peelable circuit board foil fabricated by the method described with reference to FIG. 1.

Referring to FIG. 1, a method for fabricating a peelable circuit board foil 200 is shown, in accordance with an embodiment of the present invention. A cross sectional view of the peelable circuit board foil 200 is shown in FIG. 2. At step 105 (FIG. 1) a first surface of a metal support layer 205 (FIG. 2) and a second surface of a conductive metal foil 210 (FIG. 2) are joined using an inorganic high temperature activated release structure 215 (FIG. 2). This inorganic high temperature release structure 215 provides high adhesion strength between the two metal layers 205, 210 after they are joined together at low temperatures (below 100 degrees Celsius), and provides a substantially lower adhesion strength after exposure to high temperatures that are used to add a crystallized dielectric layer to the peelable circuit board foil 200, as described below with reference to FIGS. 3 and 4. The inorganic high temperature release structure 215 comprises a co-deposited layer 250 that comprises a co-deposited admixture of nickel and one or more of boron, phosphorus, and chromium, and a metal oxide layer 260. In some embodiments, the co-deposited layer 250 may consist essentially only of nickel and one or more of boron, phosphorus, and chromium. In this context, "essentially only" allows the inclusion of trace elements, such as less than 0.5% trace elements by weight. In some embodiments, the co-deposited layer 250 may consist essentially only of nickel, one or more of boron, phosphorus, and chromium, and may include larger amounts of other materials that are inert in the release layer activation, such as copper or some other metals. In some embodiments, the amount of boron, phosphorus, and chromium may be up to 15% by weight of the ad-mixture. The co-deposited layer 250 may be formed using known techniques such as electroless or electrolytic plating. The metal oxide layer 260 may comprise an oxide such as tantalum oxide, and in some embodiments may consist essentially only of a single metal oxide. Other metal oxides such as nickel oxide are also expected to be effective, and may be mixed with other metal oxides.

In accordance with these embodiments of the present invention, the metal support layer 205 may be between 10 and 75 microns thick, and for many uses may be between 30 and 70 microns thick; the conductive metal foil 210 may be between 5 and 25 microns thick and for many uses may be between 10 and 20 microns thick; the co-deposited layer 250 may be between 1 and 10 microns thick, and for many uses may be between 1 and 4 microns thick; and the metal oxide may be less than 0.050 microns thick, and for many uses may be less than 0.025 microns thick. Because a primary application of the present invention is for fabrication of a dielectric foil (and, ultimately, the formation of capacitors in a layer or layers of multi-layer printed circuit boards), the conductive metal foil 210 of the present invention is normally thicker than that used for conventional metal foils having a release layer (for example, see U.S. Pat. No. 6,346,335). The optimum metal for the metal support layer 205 and the conductive metal foil 210 for most applications is copper or a copper alloy, but other metals such as nickel, silver, platinum, gold, or alloys thereof could be used.

Figure 3:
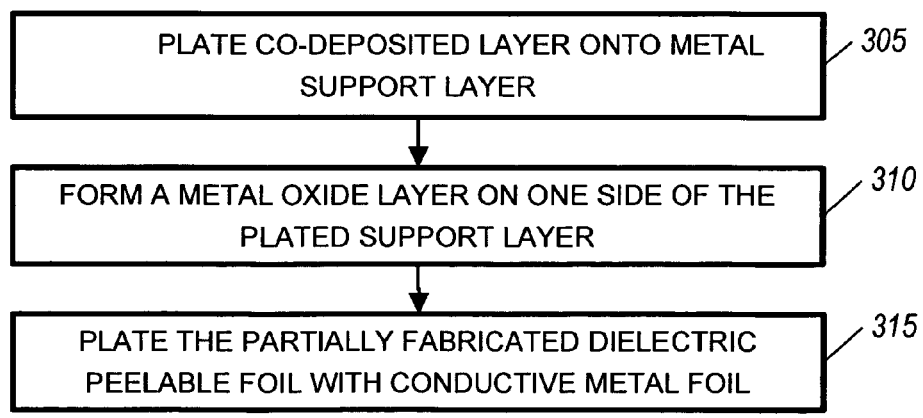
FIG. 3 is a flow chart that shows further steps of the method for fabricating a peelable circuit board foil, in accordance with some embodiments of the present invention.

Referring to FIG. 3, a flow chart shows some steps to perform the process of step 105 (FIG. 1), in accordance with some embodiments of the present invention. At step 305, the co-deposited layer 250 is formed by plating the metal support layer 205. In these embodiments, the plating process may be most efficient when both sides of the metal support layer are plated simultaneously, resulting in the formation of the co-deposited layer 250 and a second co-deposited layer 255. There may be instances where it is preferable to avoid formation of the second co-deposited layer 255 (for instance, due to the expense of the materials that are used); thus, the second co-deposited layer 255 is considered an optional layer. At step 310, the metal oxide layer 260 may then be deposited on the co-deposited layer 250 by sputtering or plating in a manner such that a layer is formed only on the co-deposited layer 250. Alternatively, the co-deposited layer 250 may be formed by plating a pure metal and then oxidizing it by an electrochemical process. The co-deposited layer 250 and the metal oxide layer 260 in the inorganic high temperature release structure 215 may be formed in the order shown in FIG. 2 and described with reference to FIG. 3, or may be formed in the reverse order. At step 315, the conductive metal foil layer 210 may be formed on the inorganic high temperature release structure 215 by plating. In these embodiments, the plating process may be most efficient when both sides of the partially fabricated dielectric peelable foil are plated simultaneously, resulting in the formation of the conductive metal foil layer 210 and a second conductive metal foil layer 265. There may be instances where it is preferable to avoid formation of the second conductive metal foil layer 265 (for instance, due to the expense of the materials that are used); thus, the second conductive metal foil layer 265 is considered an optional layer.

Referring again to FIG. 1, at step 110, a first surface 212 of the metal foil layer 210 may be coated with a high temperature anti-oxidant barrier 220 (FIG. 2), and the resulting coated first surface (221) preferably has a surface roughness less than 0.05 micron root mean square (RMS). The high temperature anti-oxidant barrier 220 may be 1 to 10 microns thick, and for many uses may be 1 to 4 microns thick, and is one that is effective to prevent any substantial oxidation of the conductive metal foil 210 during a later step in which a dielectric oxide is applied, pyrolyzed, and crystallized by known techniques, at temperatures as high as about 600 degrees Celsius, and differs from anti-tarnish coatings used for conventional peelable circuit board foils that perform well at temperatures below 100 degrees Celsius.

This high temperature anti-oxidant barrier 220 may be deposited on the conductive metal foil 210 by sputtering, electroless plating or electrolytic plating materials that may be selected from palladium, platinum, iridium, nickel, or alloys or compositions that include any combination of these metals with other materials, for example, minor amounts of aluminum or other materials, using known techniques that will achieve a surface roughness of less than 0.05 micron RMS, and that will typically achieve a surface roughness less than 0.01 micron RMS.

Nickel or nickel-phosphorus is useful as the high temperature anti-oxidant in many applications. Typically, the technique chosen to coat the conductive metal foil layer 210 will result in a second surface of one of the metal support layer 205, the second co-deposited layer 255, or the second conductive metal foil layer 265 (depending upon which is the outermost layer) also being coated with the same high temperature anti-oxidant barrier 225 (FIG. 2) to about the same thickness, but this is not a required result for the present invention. For example, a technique such as masking the second surface of the outermost layer 205, 255, or 265 with a resist or other polymer material during the plating step would result in the high temperature anti-oxidant barrier being applied to only to the conductive metal foil 210. This technique leaves the metal support layer 205 uncoated, and is an acceptable alternative technique. In contrast to conventional peelable circuit board foils, for example the CopperBond® Thin Copper Foil distributed by Olin Corporation Metals Group of Waterbury, Conn., for which the exposed surface of the conductive metal foil may be intentionally roughened by a dendrite forming process, the resulting surface of the conductive metal foil 210 of the present invention is kept smooth, with a roughness measurement less than 0.05 microns root mean square (RMS), and more preferably less than 0.01 micron RMS. Such smoothness can be achieved by known techniques that are used to form the conductive metal foil 210 and the high-temperature anti-oxidant barrier 220. The peelable circuit board foil 200 formed by the method described with reference to FIG. 1 is conveniently able to be made in sizes commensurate with conventional printed circuit boards and handled and shipped without having to use expensive techniques to protect it from wrinkling or tearing during shipment, handling, and processing.

It will be appreciated that the inorganic high temperature activated release structure 215 differs significantly from conventional release structures such as those described in U.S. Pat. No. 6,346,355 issued to Chen et al. on Feb. 12, 2002, in that Chen et al. use a layer that comprises an oxygen-containing non-metal co-deposited admixture with a pure metal, in some embodiments adjacent to a pure metal layer such as nickel, while the embodiments described herein use a co-deposited admixture of elements comprising nickel plus one or more of the elements phosphorus, boron, or chromium, adjacent a metal oxide layer.

Referring now to FIG. 4, a method for fabricating a dielectric peelable circuit board foil 500 from the peelable circuit board foil 200 is shown, in accordance with a second embodiment of the present invention. A cross sectional view of the dielectric peelable circuit board foil 500 is shown in FIG. 5. At step 405, a crystallized dielectric oxide layer 505 (FIG. 5) is formed adjacent to the conductive metal foil 210 of a peelable circuit board foil 200. In this context, "adjacent" means that the first cited layer (in this case, the crystallized dielectric oxide layer 505) is closely coupled, electrically, to the second cited layer (in this case, the conductive metal foil 210). Specific examples of the crystallized dielectric oxide according to this invention include lead zirconate titanate (PZT), lead lanthanide zirconate titanate (PLZT), lead calcium zirconate titanate (PCZT), lead lanthanide titanate (PLT), lead titanate (PT), lead zirconate (PZ), lead magnesium niobate (PMN), barium titanate (BTO) and barium strontium titanate (BSTO). Lead based dielectric oxides comprising the PZT system, particularly compositions comprising the PCZT formula $PbCa_x(ZrO_{0.52}Ti_{0.48})O_3$, where x is from 0.01 to 0.1, are particularly attractive. The addition of small quantities of elements such as Ni, Nb, Ca and Sr in compounds that do not specifically name them can also improve electrical performance. Accordingly, the dielectric oxides of the present invention may also contain small quantities of Ni, Nb, Ca and Sr.

The crystallized dielectric oxide is formed at step 405 by one of a broad range of deposition techniques, such as chemical solution deposition (CSD), evaporation, sputtering, physical vapor deposition and chemical vapor deposition. These techniques typically require either a high-temperature deposition or a high-temperature crystallization at temperatures that may be as high as 600 degrees Celsius, and result in a crystalline coating on the conductive metal foil 210 that is polycrystalline in form and quite flexible, while maintaining excellent dielectric properties for forming capacitors even when flexed. An economical, well known technique that can be used for forming the crystalline dielectric oxide layer is to use CSD. Another economical technique for forming the crystalline dielectric oxide layer is powder coating using a powder or powder suspension. The crystallized dielectric oxide layer 505 may be formed with a thickness from about 0.1 to about 1 micron. When the crystallized dielectric oxide layer 505 is PCZT, it may be formed to be 0.2-0.6 micron thick for many uses. The dip coating technique and other techniques may also result in the formation of a sacrificial crystallized dielectric oxide layer 510 adjacent the metal support layer 205, but this layer is not required for the present invention. Allowing the formation of the sacrificial crystallized dielectric oxide layer is projected to be less costly than attempting to prevent its formation, and serves to reduce curling of the foil layer that may result when only the crystallized dielectric oxide layer 505 is formed.

At step 405, the inorganic high temperature activated release structure 405 is activated by the high temperatures employed to crystallize the dielectric. When activated, the tensile strength of the bond of between the metal support layer 205 and the conductive metal foil 210 is significantly reduced. In one experiment, the tensile strength was reduced by more than a factor of three, allowing subsequent peeling to occur without substantial risk of tearing the material. While not wishing to be bound by theory, the inventors believe one explanation of the unique aspect of temperature activation of the release material structure may be that sufficiently high temperatures cause migration of phosphorus from the co-deposited mixture to the interface with the metal oxide, where it forms new molecules, such as nickel phosphate, that reduce the tensile strength. An experiment has shown that temperatures above 450 degrees Celsius will activate the types of inorganic high temperature activated release structures described herein. Thus, step 405 accomplishes the activation as well as the crystallization of the dielectric. The "peelablity" of the types of inorganic high temperature activated release structures described herein appears to be more consistent than other release layers, such as those described in U.S. application Ser. No. 10/682,557 filed on Oct. 9, 2003 and published on Apr. 14, 2005 as U.S. Patent Publication US-2005-0079375-A1.

The peelable circuit board foil 500 formed by the method described with reference to step 405 of FIG. 4 can be conveniently made in sizes commensurate with conventional printed circuit boards and handled and shipped without having to use expensive techniques to protect it from wrinkling or tearing during shipment, handling, and processing. This peelable circuit board foil 500 can then be used to apply the dielectric layer 505 and the conductive metal foil layer 210 within (or on) a flexible or rigid printed circuit board stack to form capacitors having different dielectric areas. In some embodiments that do not use optional step 410 (FIG. 4) (described below), this is done at step 415 (FIG. 4) by adhering the dielectric layer 505 of the peelable circuit board foil 500 to a conductive metal layer surface of a flexible or rigid printed circuit board stack using an appropriate conductive adhesive material or other known technique, then peeling away a group of sacrificial layers 520 (FIG. 5) at step 420 (FIG. 4) that includes the metal support layer 205, the sacrificial crystallized dielectric oxide layer 510, and the high temperature anti-oxidant barrier 225 This leaves a group of layers 525 including the dielectric oxide layer 505 and the conductive foil layer 220 adhered to the printed circuit board.

Referring to FIG. 6, a cross sectional diagram illustrates the step 420 of peeling, in accordance with some embodiments of the present invention. The dotted lines 605 illustrate the group of sacrificial layers 520 while in the process of being peeled from a printed circuit board 610 to which the group of layers 525 that include the dielectric oxide layer 505 have been added. When the peeling is completed, the process may be followed by well known etching and metal deposition steps that form individual capacitors. In one embodiment, a single capacitor is formed within an entire layer of the printed circuit board, such as for a power source layer.

Referring again to FIGS. 4 and 5, at optional step 410 (FIG. 4), an electrode layer 515 (FIG. 4) may be formed adjacent the crystallized dielectric layer 505 on the conductive metal foil 210 (i.e., on the surface of the crystallized dielectric layer that is opposite the conductive metal foil 210), using a well known technique such as sputtering or electroless plating or electrolytic plating. An adhesion layer 527 may be added between the electrode layer 515 and the crystallized dielectric layer 505 to achieve a desired adhesion strength. A typical thickness for the electrode layer 515 is 2 to 20 microns. Depending on the technique used to apply the electrode layer 515, a sacrificial electrode layer 522 of approximately the same thickness as the electrode layer 415 and a sacrificial adhesion layer 530 may also be formed, but this is not required for the present invention.

The peelable circuit board foil with the electrode layer 515 can be laminated to a circuit board substrate at step 415 (FIG. 4), e.g., by pressing onto a prepreg layer (glass-reinforced B-stage epoxy), which is a well known technique that uses pressure and temperature to flow and then cure the epoxy. When the metal support layer 205 is peeled away from the conductive metal foil layer 210 at step 420 (FIG. 4), the sacrificial electrode layer 522, if present, is also peeled away, as shown by dotted lines 605 in FIG. 6.

By now it should be appreciated that the peelable circuit board foils 200, 500 and the processes to fabricate them provide foils that economically facilitate the addition of capacitors to flexible and rigid circuit boards. The inorganic high temperature activated release layer becomes effective after exposure to the high temperatures of pyrolysis and crystallization; the peelable metal support layer and double layers of crystallized dielectric oxide (in one embodiment) help provide a foil that is formed flat and does not wrinkle or crease, and the sacrificial metal support and dielectric oxide layers may be easily removed during the process of adding a capacitive layer to a circuit board using the present invention.

In the foregoing specification, the invention and its benefits and advantages have been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims.

As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "including" and/or "having", as used herein, are defined as comprising.

What is claimed is:

1. A peelable circuit board foil, comprising:
a metal support layer having a first and a second surface;
a conductive metal foil layer having a first and a second surface; and
an inorganic release structure disposed between and contacting the first surface of the metal support layer and the second surface of the conductive metal foil layer, wherein the inorganic release structure comprises:
   a layer that is a co-deposited admixture of nickel and one or more of boron, phosphorus, and chromium; and
   a layer that is a metal oxide.

2. The peelable circuit board foil according to claim 1, further comprising a high temperature anti-oxidant layer adjacent the first surface of the conductive metal foil layer.

3. dielectric peelable circuit board foil, comprising:
a metal support layer having a first and a second surface;
a conductive metal foil layer having a first and a second surface;
an inorganic high temperature activated release structure disposed between and contacting the first surface of the metal support layer and the second surface of the conductive metal foil layer; and
a first crystallized dielectric oxide layer disposed adjacent the first surface of the conductive metal foil layer, wherein said first crystallized dielectric oxide layer is selected from the group consisting of lead titanate, lead zirconate, lead magnesium niobate, barium titanate, strontium titanate, and combinations thereof.

4. The dielectric peelable circuit board foil according to claim 3, wherein a tensile strength of the inorganic high temperature activated release layer reduces at least 2.5 times when heated to a temperature that is between 450 degrees and 650 degrees Celsius.

5. The dielectric peelable circuit board foil according to claim 3, wherein the inorganic high temperature activated release structure comprises:
a layer that is a co-deposited admixture of nickel and one or more of boron, phosphorus, and chromium; and
a layer that is a metal oxide.

6. The dielectric peelable circuit board foil according to claim 5, wherein the layer that is a co-deposited admixture is less than 10 microns thick and the layer that is a metal oxide is less than 0.1 microns thick.

7. The dielectric peelable circuit board foil according to claim 3, wherein:
the inorganic high temperature release structure is less than 10 microns thick;
the metal support layer is between 10 and 75 microns thick;
the conductive metal foil layer is between 5 and 25 microns thick; and the first crystallized dielectric oxide layer is less than one micron thick.

8. The dielectric peelable circuit board foil according to claim 3, wherein:
the inorganic high temperature release structure is less than 5 microns thick;
the metal support layer is between 30 and 70 microns thick;
the conductive metal foil layer is between 10 and 20 microns thick; and
the first crystallized dielectric oxide layer is less than one micron thick.

9. The dielectric peelable circuit board foil according to claim 3, further comprising a high temperature anti-oxidant barrier disposed between and contacting the first crystallized dielectric oxide layer and the first surface of the conductive metal foil layer, wherein the high temperature anti-oxidant barrier is formed from a material effective to prevent any substantial oxidation of the conductive metal foil layer during pyrolysis and crystallization of the first crystallized dielectric oxide layer.

10. The dielectric peelable circuit board foil according to claim 9, wherein the high temperature anti-oxidant barrier is formed from palladium, platinum, iridium, nickel, or alloys or compositions that include any combination of these metals.

11. The dielectric peelable circuit board foil according to claim 3, further comprising:
a conductive metal electrode layer disposed adjacent to a surface of the first crystallized dielectric oxide layer that is opposite the conductive metal foil layer.

12. The dielectric peelable circuit board foil according to claim 3, wherein the metal support layer and conductive metal foil layer each comprise a metal selected from a group consisting of copper, copper alloys, nickel, and nickel alloys.

* * * * *